US008879214B2

(12) United States Patent
Nishioka

(10) Patent No.: US 8,879,214 B2
(45) Date of Patent: Nov. 4, 2014

(54) HALF METAL TRILAYER TMR READER WITH NEGATIVE INTERLAYER COUPLING

(75) Inventor: Koichi Nishioka, Kanagawa (JP)

(73) Assignee: HGST Netherlands B.V., Amsterdam (NL)

( * ) Notice: Subject to any disclaimer, the term of this patent is extended or adjusted under 35 U.S.C. 154(b) by 107 days.

(21) Appl. No.: 13/333,981

(22) Filed: Dec. 21, 2011

(65) Prior Publication Data
US 2013/0164549 A1 Jun. 27, 2013

(51) Int. Cl.
G11B 5/39 (2006.01)
(52) U.S. Cl.
USPC .................................................. 360/324.12
(58) Field of Classification Search
CPC ...................... G11B 5/3903; G11B 2005/3996; G11B 5/3909; G11B 5/3906; G11B 5/3967
USPC ................................ 360/313–315, 324–324.2
See application file for complete search history.

(56) References Cited

U.S. PATENT DOCUMENTS

| 5,576,914 | A | 11/1996 | Rottmayer et al. | |
| 6,820,322 | B2 | 11/2004 | Pinarbasi | |
| 6,847,509 | B2 | 1/2005 | Yoshikawa et al. | |
| 7,035,062 | B1 | 4/2006 | Mao et al. | |
| 7,177,122 | B2 | 2/2007 | Hou et al. | |
| 7,251,110 | B2 | 7/2007 | Lee et al. | |
| 7,408,749 | B2 | 8/2008 | Gill | |
| 7,440,241 | B2 | 10/2008 | Hoshino et al. | |
| 7,615,996 | B1 * | 11/2009 | Machita et al. | 324/252 |
| 8,031,445 | B2 * | 10/2011 | Zhou et al. | 360/324.12 |
| 8,072,714 | B2 * | 12/2011 | Sato et al. | 360/324.2 |
| 8,149,548 | B2 * | 4/2012 | Hatatani et al. | 360/324.12 |
| 8,179,642 | B2 * | 5/2012 | Kawamori et al. | 360/319 |
| 8,390,963 | B2 * | 3/2013 | Dimitrov et al. | 360/319 |
| 8,400,738 | B2 * | 3/2013 | Covington et al. | 360/324.12 |
| 8,437,106 | B2 * | 5/2013 | Yanagisawa et al. | 360/319 |
| 2007/0030603 | A1 | 2/2007 | Sato et al. | |
| 2007/0091513 | A1 * | 4/2007 | Sbiaa et al. | 360/324.11 |
| 2007/0253119 | A1 * | 11/2007 | Carey et al. | 360/324.11 |
| 2008/0232003 | A1 | 9/2008 | Ibusuki et al. | |
| 2009/0130491 | A1 * | 5/2009 | Ohta et al. | 428/811.2 |
| 2009/0141410 | A1 | 6/2009 | Jogo et al. | |
| 2009/0268353 | A1 * | 10/2009 | Carey et al. | 360/324.12 |

(Continued)

FOREIGN PATENT DOCUMENTS

JP 2002319112 A * 10/2002

OTHER PUBLICATIONS

Borsa et al., "Development of epitaxial nitride-based bilayers for magnetic tunnel junctions," IEEE Transactions in Magnetics (Sep. 2002) 38 (5): 2709-2711.

Primary Examiner — Will J Klimowicz
(74) Attorney, Agent, or Firm — Billion & Armitage

(57) ABSTRACT

In an embodiment of the invention, a trilayer magnetoresistive sensor comprises an underlayer on which a first free layer is deposited. A barrier layer is then deposited after which a second free layer is deposited. A capping layer is then deposited above second free layer. The first free layer is a layer which includes at least a layer of a nitride of an element including at least one of Fe, Co, or Ni, or a multiple laminate structure of a layer containing a nitride of an element including at least one of Fe, Co, Ni and another ferromagnetic layer containing at least one of Fe, Co, or Ni. The combination of the first and second free layers causes anti-parallel coupling.

22 Claims, 11 Drawing Sheets

(56) References Cited

U.S. PATENT DOCUMENTS

| | | |
|---|---|---|
| 2010/0103564 A1 | 4/2010 | Nishioka et al. |
| 2010/0214701 A1* | 8/2010 | Tsuchiya et al. ......... 360/324.12 |
| 2011/0007420 A1 | 1/2011 | Tsuchiya et al. |
| 2011/0007421 A1 | 1/2011 | Hara et al. |
| 2012/0134057 A1* | 5/2012 | Song et al. .................... 360/319 |
| 2012/0229935 A1* | 9/2012 | Song et al. .................... 360/313 |
| 2012/0268846 A1* | 10/2012 | Gadbois et al. ............... 360/319 |
| 2013/0027031 A1* | 1/2013 | Dimitrov et al. .............. 324/252 |
| 2013/0065085 A1* | 3/2013 | Dimitrov et al. .............. 428/810 |
| 2013/0071692 A1* | 3/2013 | Covington et al. ........... 428/815 |
| 2013/0149559 A1* | 6/2013 | Covington et al. ........... 428/816 |

* cited by examiner

HALF METAL TRILAYER TMR READER WITH NEGATIVE INTERLAYER COUPLING

FIELD OF THE INVENTION

The present invention generally relates to the field of computer hard disks. More particularly, the present invention relates to a trilayer magnetoresistive sensor and to a method for making a trilayer magnetoresistive sensor.

BACKGROUND OF THE INVENTION

A read/write head in a disc drive typically includes a magnetoresistive (MR) read transducer that is deposited between non-magnetic layers and magnetic shield layers. The magnetoresistive read transducer typically includes a magnetoresistor, electrical contacts and one or more bias magnets that magnetically bias the magnetoresistor. Various magnetic biasing arrangements in the magnetoresistive sensor can be used to improve uniformity, predictability, linearity, and/or reduce noise.

Domains formed in the nearby magnetic shield layers can also magnetically bias the magnetoresistor. Control of both domain magnetization direction and domain wall location in the shields are important for the proper operation of the magnetoresistive transducer because of magnetic interaction between the magnetoresistor and the shield.

Some shield designs control the location of domain walls by control of the shield shape. Other shield designs control the polarity of magnetic domains by removing all domain walls and forcing the shield into a single domain state. A side effect of these single domain state designs is that, without closure domains, magnetic charge forms at the edge of the shield that can cause track erasure and loss of data.

Hard-disk technology is constantly evolving. In hard drive technology, the sensor that detects magnetic information on a rotating disk has played an important role. Today's sensors are drastically different from those used even a few years ago. For example, modern sensors can detect and transmit information from recorded data at densities greater than 200 Gbit/$in^2$ and data rates approaching 1 GHz. Advances in nanomagnetics, magnetic ultrathin films, magneto-electronics, as well as device processing, have advanced this technology. It can be expected that the future will continue to bring advances in sensor technology.

The read sensor in the recording head of hard-disk drives (HDD), based on the phenomenon of giant magnetoresistance (GMR), is an example of the commercialization of magnetic nanotechnology and spintronics. The basic magnetoresistive film can be composed of a dozen or more layers of magnetic and non-magnetic materials whose effective thickness is controlled down to sub-Angstrom level. Each of these layers directly determines or affect the magnetic and magnetotransport behavior.

From this multilayer, a working sensor and head are created after, for example, over 250 processing steps, using techniques that are near the limits of current lithography, combining insulating and conducting materials, hard magnet biasing, and magnetic shielding. The sensor is designed to fly just a few nanometers above a spinning disk at up to 15000 revolutions per minute.

The recording head has three main components: (1) the read sensor ("reader"); (2) the write transducer ("writer"), which is a microfabricated planar electromagnet with a narrow pole that creates a high density of magnetic flux in proximity to the media; and (3) the slider, which is a shaped piece of substrate (typically alumina-titanium carbide) onto which the writer and read sensor are built, and is engineered to "fly" only a few nanometers above the spinning media disk.

For any sensor, there is an appropriate combination of writer and slider which forms a coherent recording head device and, together with the chosen media, mechanical characteristics, and electronics, forms a complete recording system. The recording environment in which the head is expected to operate is first introduced, including media characteristics, magnetic interference and shielding, and signal-to-noise (SNR) considerations. These constraints put specific boundaries on the sizes, geometries, and magnetic properties which a read sensor must achieve.

The magnetic recording process utilizes a thin film transducer for the creation or writing of magnetized regions (bits) onto a thin film disk and for the detection or reading of the presence of transitions between the written bits. The thin film transducer is referred to as a thin film head. It consists of a read element, which detects the magnetic bits, and a write element, which creates or erases the bits.

FIG. 1 is a schematic of the recording process. Shown in FIG. 1 is read sensor 102, write element 104, and recording medium 106. The perpendicular write element 104 writes magnetic transitions vertically within recording medium 106 by orienting the write field perpendicular to the direction of the recording film surface. The magnetic field created by this perpendicular head returns to this element through a magnetically soft underlayer 110 within the medium, or return path. In this way the recording medium 106 lies within the write gap. The resulting perpendicular write fields can be up to two times larger than longitudinal write fields, thus enabling the perpendicular write element to write information on high coercivity media that is inherently more thermally stable. In perpendicular recording, the bits do not directly oppose each other resulting in a significantly reduced transition packing. This allows bits to be more closely packed with sharper transition signals, facilitating easier bit detection and error correction. During a read operation, read sensor 102 detects perpendicular bits 108 on recording medium 106.

In a disk recording system, successive bits are written onto the disk surface in concentric rings or tracks separated by a guard band. The head transducer is attached to a suspension, and the suspension is attached to an actuator which controls the position of the transducer in a plane above the disk surface. A specially-designed topography on the lower surface of the slider (known as the air-bearing surface or ABS) allows the head to "fly" above the rotating disk (typically 4200-15000 rpm), and controls the height of the transducer above the disk surface, typically 10 to 15 nm.

Referring now to FIG. 2, there is shown an implementation of a disk drive 200. As shown in FIG. 2, at least one rotatable magnetic disk 212 is supported on a spindle 214 and rotated by a disk drive motor 218. The magnetic recording on each disk is in the form of annular patterns of concentric data tracks on the magnetic disk 212.

At least one slider 213 is positioned near the magnetic disk 212, each slider 213 supporting one or more magnetic head assemblies 221. As the magnetic disk rotates, slider 213 moves radially in and out over the disk surface 222 so that the magnetic head assembly 221 may access different tracks of the magnetic disk where desired data are written. Each slider 213 is attached to an actuator arm 219 by way of a suspension 215.

Suspension 215 provides a spring force which biases slider 213 against disk surface 222. Each actuator arm 219 is attached to actuator 227. Actuator 227 as shown in FIG. 2 may be a voice coil motor (VCM). The VCM comprises a coil movable within a fixed magnetic field, the direction and speed of the coil movements being controlled by the motor current signals supplied by controller 229.

During operation of the disk storage system, the rotation of magnetic disk 212 generates an air bearing between slider 213 and the disk surface 222 which exerts an upward force or lift on the slider. The air bearing thus counter-balances the spring force of suspension 215 and supports slider 213 off and slightly above the disk surface by a small, substantially constant spacing during normal operation.

The various components of the disk storage system are controlled in operation by control signals generated by control unit 229. Control signals may also include internal clock signals. Typically, control unit 229 comprises logic control circuits, digital storage and a microprocessor. Control unit 229 generates control signals to control various system operations such as drive motor control signals on line 223 and head position and seek control signals on line 228. The control signals on line 228 provide the desired current profiles to optimally move and position slider 213 to the desired data track on disk 212. Write and read signals are communicated to and from write and read heads 221 by way of recording channel 225.

With reference to FIG. 3, the orientation of magnetic head 221 in slider 213 can be seen in more detail. FIG. 3 is an ABS view of slider 213, and as can be seen, the magnetic head, including an inductive write head and a read sensor, is located at a trailing edge of the slider. The above description of a typical magnetic disk storage system, and the accompanying illustrations of FIG. 1-3 are for representation purposes only. It should be apparent that disk storage systems may contain a large number of disks and actuators, and each actuator may support a number of sliders.

In recent read head designs, a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \theta$, where $\theta$ is the angle between the magnetizations of the pinned and free layers. In a read mode, the resistance of the spin valve sensor changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP spin valve includes first and second magnetic layers separated by a thin non-magnetic coupling layer such as Ru. The thickness of the spacer layer is chosen so as to antiparallel couple the magnetizations of the ferromagnetic layers of the pinned layer. A spin valve is also known as a top or bottom spin valve depending upon whether the pinning layer is at the top (formed after the free layer) or at the bottom (before the free layer).

The spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

Magnetization of the pinned layer is usually fixed by exchange coupling one of the ferromagnetic layers (AP1) with a layer of antiferromagnetic material such as PtMn or IrMn. While an antiferromagnetic (AFM) material such as PtMn or IrMn does not in and of itself have a magnetization, when exchange coupled with a magnetic material, it can strongly pin the magnetization of the ferromagnetic layer.

In order to meet the ever increasing demand for improved data rate and data capacity, research has focused on the development of perpendicular recording systems. A traditional longitudinal recording system stores data as magnetic bits oriented longitudinally along a track in the plane of the surface of the magnetic disk. This longitudinal data bit is recorded by a fringing field that forms between a pair of magnetic poles separated by a write gap.

A perpendicular recording system, on the other hand, records data as magnetic transitions oriented perpendicular to the plane of the magnetic disk. The magnetic disk has a magnetically soft underlayer covered by a thin magnetically hard top layer. The perpendicular write head has a write pole with a very small cross section and a return pole having a much larger cross section. A strong, highly concentrated magnetic field emits from the write pole in a direction perpendicular to the magnetic disk surface, magnetizing the magnetically hard top layer. The resulting magnetic flux then travels through the soft underlayer, returning to the return pole where it is sufficiently spread out and weak that it will not erase the signal recorded by the write pole.

The advent of perpendicular recording systems has lead to an increased interest in Current Perpendicular to Plane (CPP) sensors, which are particularly suited to use in perpendicular recording systems, due to their ability to meet higher linear density requirements. A CPP sensor differs from a more conventional Current In Plane (CIP) sensor such as that discussed above in that the sense current flows through the CPP sensor from top to bottom in a direction perpendicular to the plane of the layers making up the sensor. Whereas the more traditional CIP sensor has insulation layers separating it from the shields, the CPP sensor contacts the shields at its top and bottom surfaces, thereby using the shields as leads.

One type of CPP sensor is a tunnel valve or tunnel magnetoresitive (TMR) sensor. Such sensors have a magnetic free layer and a magnetic pinned layer similar to a GMR or spin valve. The tunnel valve, however, has a thin electrically insulating barrier layer sandwiched between the free and pinned layers rather than an electrically conductive spacer layer.

The above description of a typical magnetic disk storage system, and the accompanying illustrations of FIG. 1-3 are for representation purposes only. It should be apparent that disk storage systems may contain a large number of disks and actuators, and each actuator may support a number of sliders.

To increase the recording density of a hard disk drive, it is necessary to shorten the length of recording bits and the pitch of the recording tracks on the recording medium. To ensure that recording bits with a short bit length play back without error, it is necessary to reduce the recording gap length (read gap length) of the playback head.

Playback heads are generally provided with two magnetic shields and a sensor element between the two magnetic shields. The gap between the two shields is the playback gap length. For increased density, the playback gap length needs to be made as small as possible. For example, the playback gap length needs to be less than 20 nm at recording densities of 2 Tbpsi and less than 15 nm at recording densities of 5 Tbpsi.

The thickness of the sensor for playback heads that are currently in use approximately 20 nm at its thinnest. To have a playback gap length of less than 20 nm, the sensor film must be made thinner than 20 nm. Because currently used sensor films have an approximate minimum thickness of 20 nm, it is not possible to have a playback head length of less than 20 nm.

There exists a need in the art for a magnetoresistive sensor that can be made thinner. A thinner magnetoresistive sensor would allow for increased recording densities among other things.

SUMMARY OF THE INVENTION

In an embodiment of the invention, a trilayer magnetoresistive sensor comprises an underlayer on which a first free layer is deposited. A barrier layer is then deposited after which a second free layer is deposited. A capping layer is then deposited above second free layer. The first free layer is a layer which includes at least a layer of a nitride of an element including at least one of Fe, Co, or Ni, or a multiple laminate structure of a layer containing a nitride of an element including at least one of Fe, Co, Ni and another ferromagnetic layer containing at least one of Fe, Co, or Ni. In an embodiment, the second free layer is an alloy ferromagnetic layer containing at least one element of Fe, Co and Ni, or a multiple laminate structure with a different composition of an alloy ferromagnetic layer containing at least one element of Fe, Co, and Ni. The combination of the first and second free layers causes anti-parallel coupling (i.e., J<0). This embodiment of the invention can be made thinner than 20 nm so as to achieve high levels of recording densities.

In another embodiment of the invention, a trilayer magnetoresistive sensor comprising an underlayer on which a first free layer is formed. A barrier layer is formed on the first free layer, and a second free layer is formed on the barrier layer. A capping layer is then formed above second free layer. The first free layer includes a nitride of an element including at least one of Fe, Co, or Ni, or a multiple laminate structure of a layer containing a nitride of an element including at least one of Fe, Co, or Ni and another ferromagnetic layer containing at least one of Fe, Co, or Ni. The other free layer is preferably a Heusler ferromagnetic layer or a multiple laminate structure with a different composition of a Heusler ferromagnetic layer and an alloy ferromagnetic layer containing at least one element of Fe, Co, or Ni. The combination of the first and second free layers causes anti-parallel coupling (i.e., J<0). This embodiment of the invention can be made thinner than 20 nm so as to achieve high levels of recording densities.

Another embodiment of the invention provides a trilayer magnetoresistive sensor that comprises an underlayer with a first free layer above. A barrier layer is formed over the first free layer. A second free layer is formed above the barrier layer. A cap layer is formed above the second free layer. The first free layer comprises a first ferromagnetic layer (AP1), an antiparallel coupling layer, and a second ferromagnetic layer (AP2) which is in below the barrier layer. With the magnetic moment of AP1 and AP2 in an anti-parallel state, the magnetic moment of AP1 is greater than the magnetic moment of AP2. The second free layer comprises at least one element of Fe, Co or Ni, or a multiple laminate structure with a different composition of alloy ferromagnetic layers containing at least one element of Fe, Co, or Ni. The magnetic interaction effect between AP2 and the second free layer is parallel coupling (i.e., J>0). The magnetic moment of the first free layer (e.g., the combined magnetic moment of AP1 and AP2) is anti-parallel to the magnetic moment of AP2, so there is anti-parallel coupling (i.e., J<0) in the magnetic interaction between the first and second free layers. This embodiment of the invention can be made thinner than 20 nm so as to achieve high levels of recording densities.

BRIEF DESCRIPTION OF THE DRAWINGS

The following drawings will be used to more fully describe embodiments of the present invention.

DETAILED DESCRIPTION OF THE INVENTION

The following description is of certain preferred embodiments presently contemplated for carrying out this invention. This description is made for the purpose of illustrating the general principles of this invention and is not meant to limit the inventive concepts claimed herein.

Figure 1:
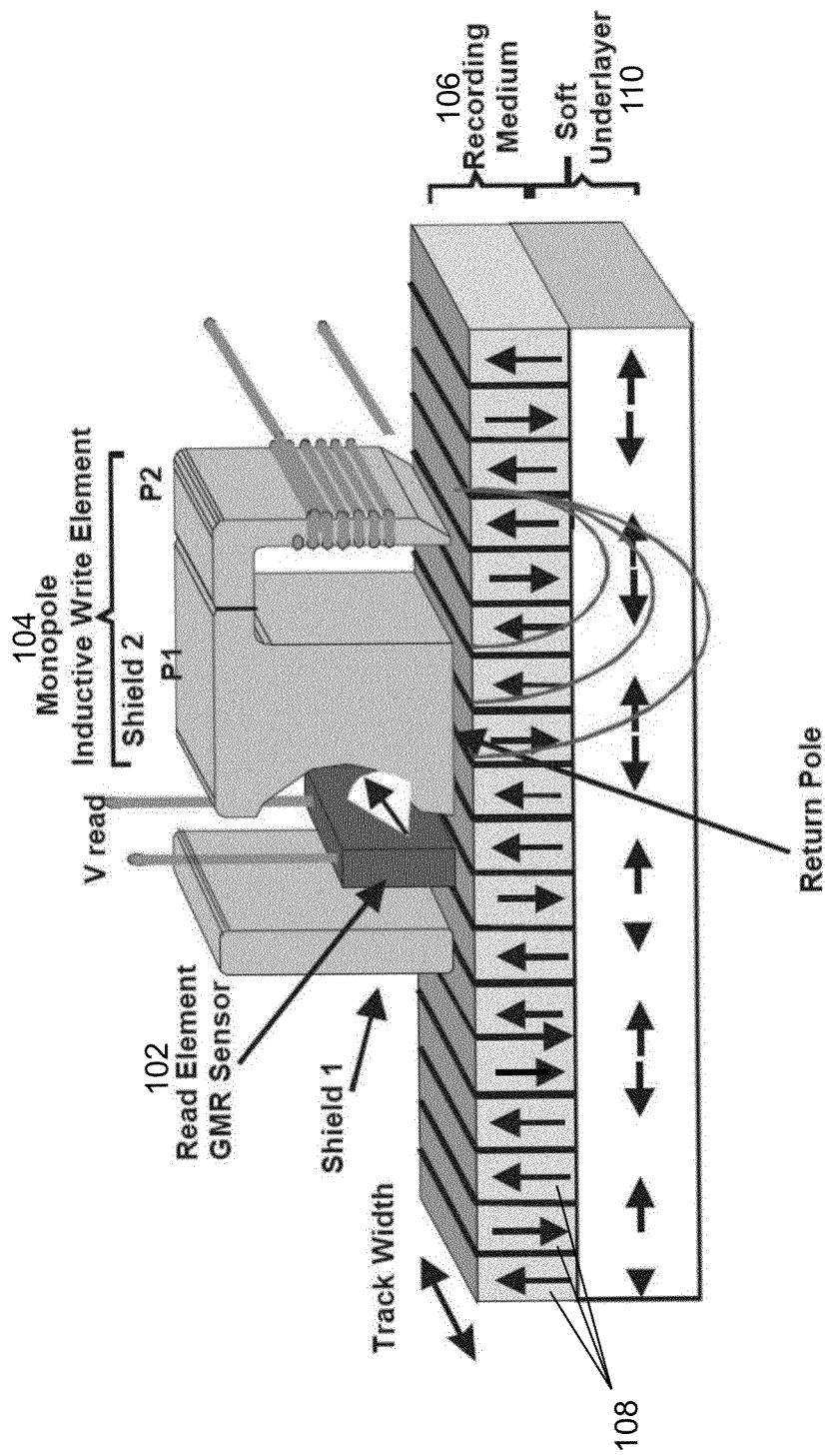
FIG. 1 is schematic illustration of a disk drive reader and sensor.
Figure 2:
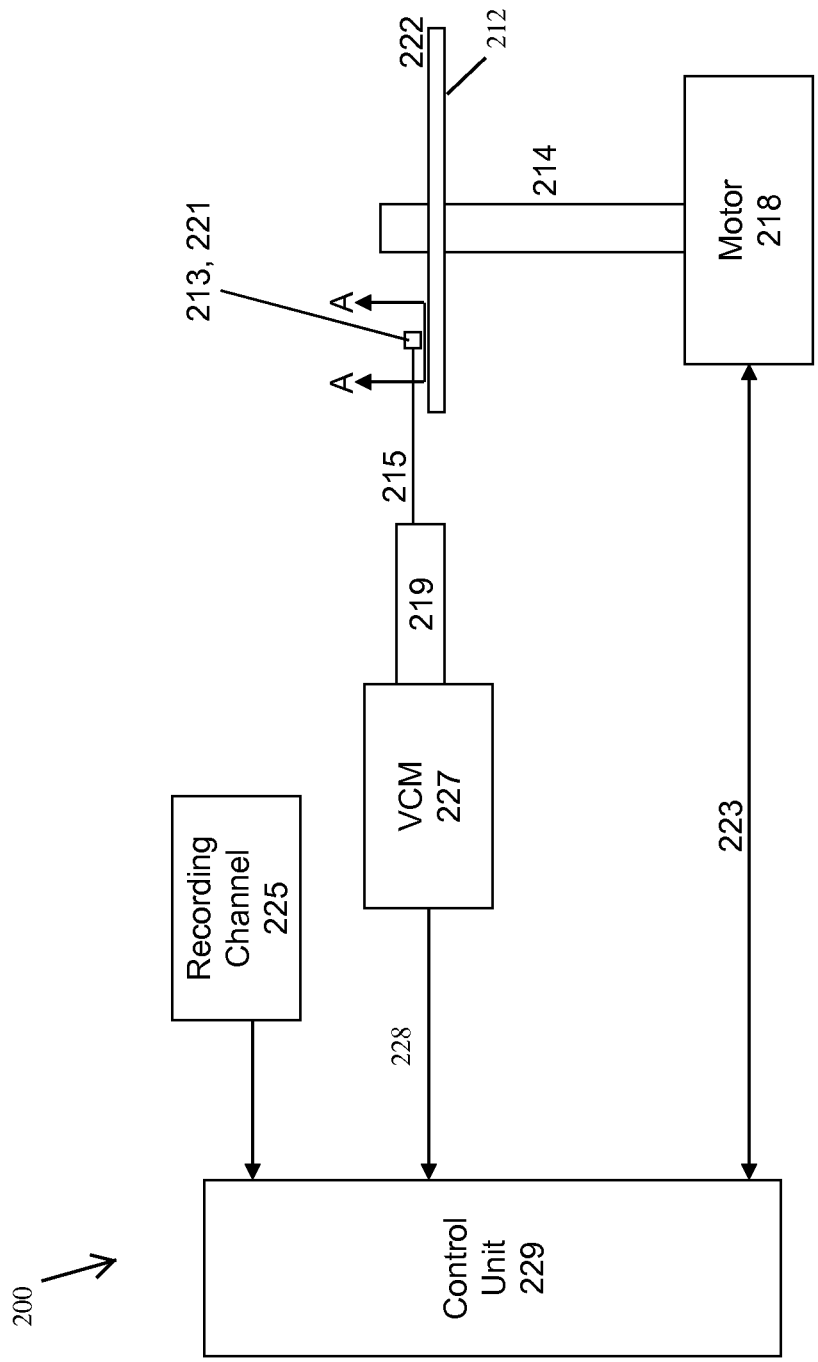
FIG. 2 is a schematic illustration of a disk drive system in which the invention might be embodied.
Figure 3:
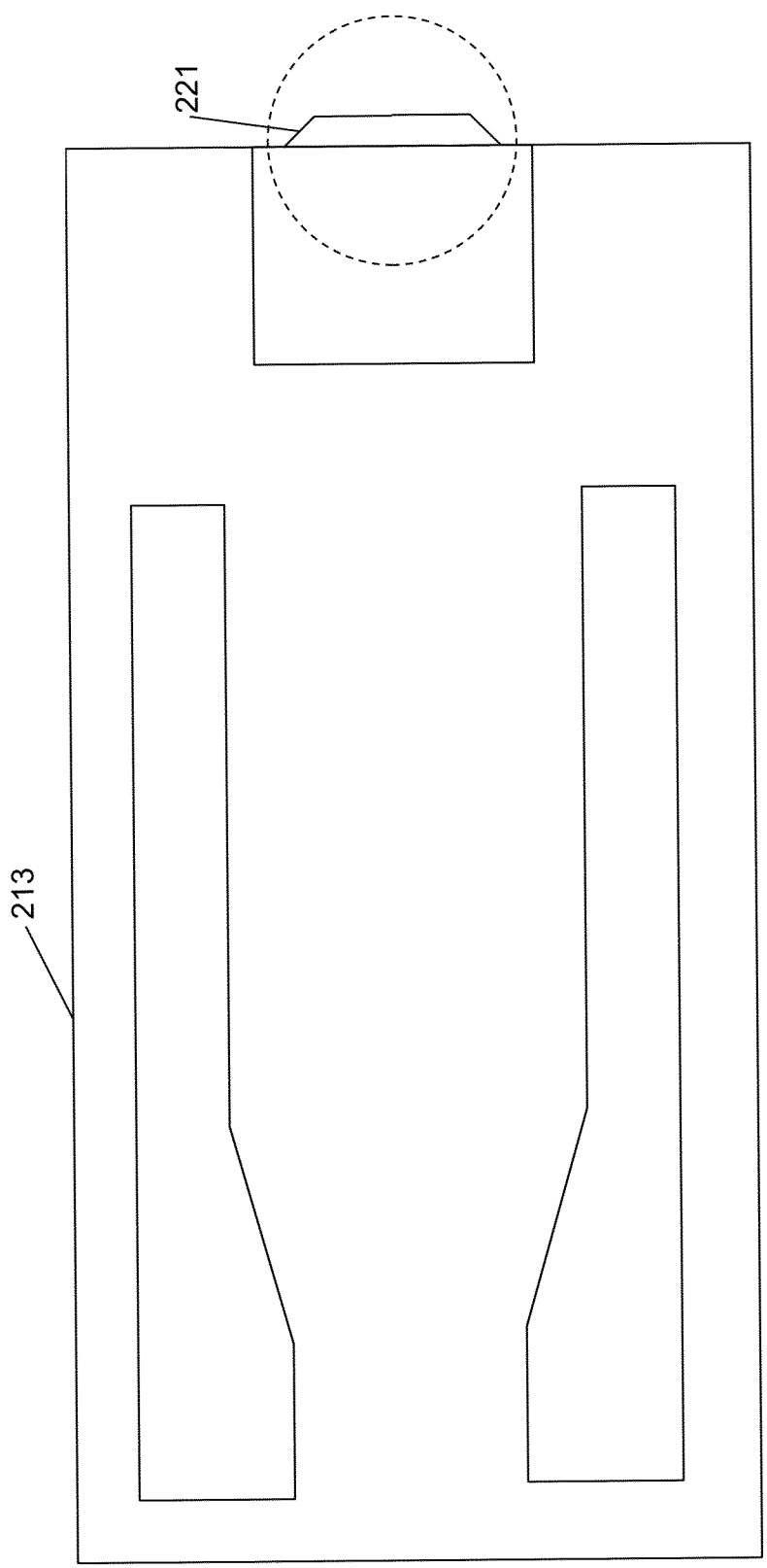
FIG. 3 is an ABS view of a slider illustrating the location of a magnetic head thereon.
Figure 4:
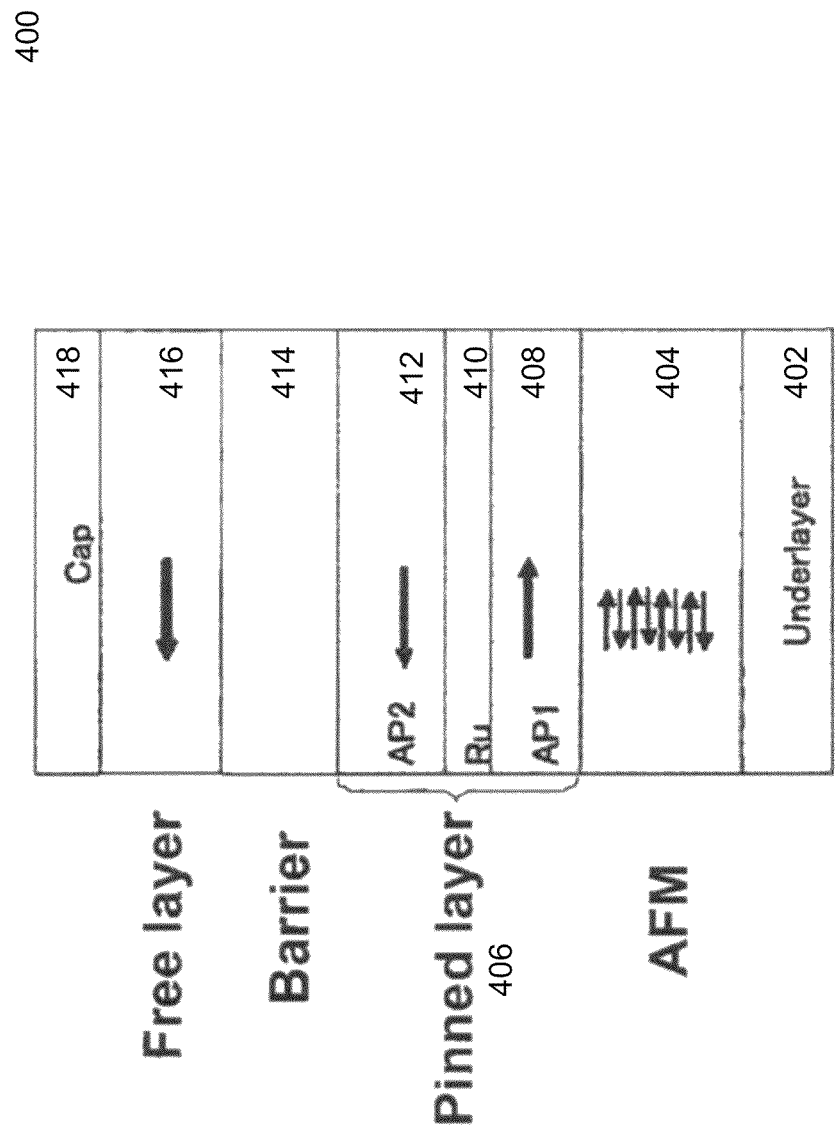
FIG. 4 shows a example of a conventional structure for a sensor.

A currently used structure of the sensor film is a type known as a spin-valve with the structure 400 as shown in FIG. 4. Structure 400 comprises an underlayer 402 with an anti-ferromagnetic layer 404 above underlayer 402. A pinned layer 406 is then deposited on antiferromagnetic layer 404. In an embodiment, pinned layer 406 comprises a first ferromagnetic layer (AP1) 408, an antiparallel coupling layer 410, and a second ferromagnetic layer (AP2) 412. A barrier layer 414 is deposited over pinned layer 406 with free layer 416 deposited thereafter. On top is capping layer 418.

In this way, the current sensor film has a structure 400 with the structure of the thinnest layer having an underlayer 402 of 2 nm, an anti ferromagnetic layer 404 of 5 nm, a pinned layer 406 of 5 nm, a barrier layer 414 of 1 nm, a free layer 416 of 5 nm and a capping layer 418 of 2 nm. The thinnest possible sensor film is thus approximately 20 nm.

Figure 5:
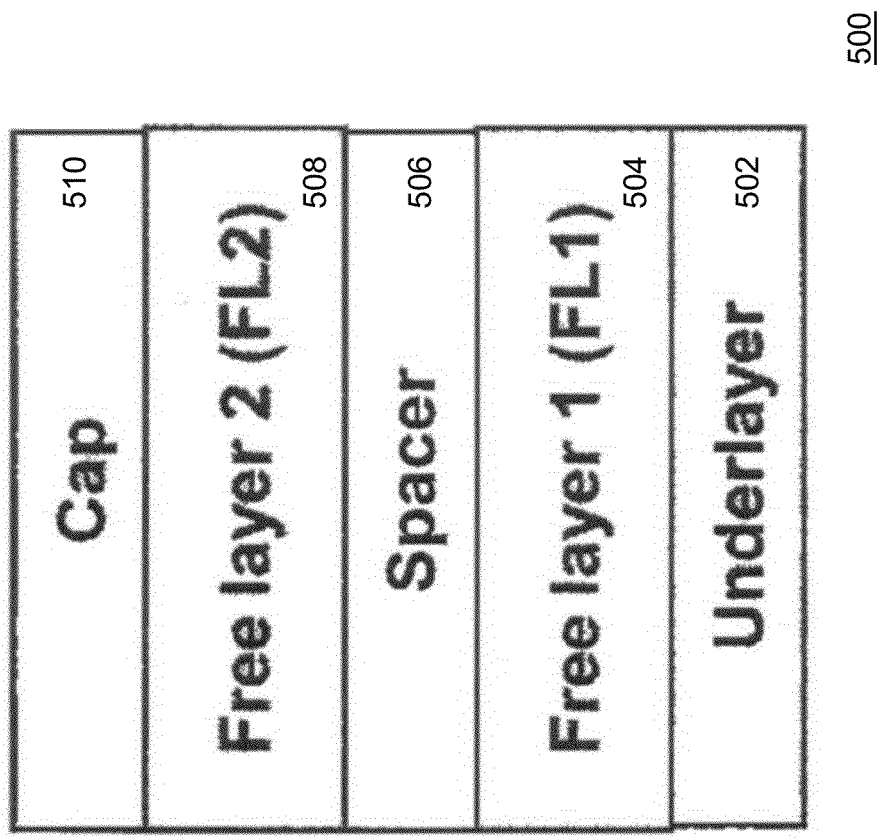
FIG. 5 shows a conventional structure for a spin-valve sensor film.

Another structure 500 has been proposed for the sensor as shown in FIG. 5. The structure 500 comprises underlayer 502 with first free layer 504 above underlayer 502. Spacer layer 506 is then deposited. Second free layer 508 is subsequently deposited after which capping layer 510 is deposited. Compared to the currently used sensor structure, there is no antiferromagnetic layer (see 404 of FIG. 4) or pinned layer comprising three layers (see 406, 408, 410, and 412 of FIG. 4). Instead, there is first free layer 504. Because the main part of structure 500 comprises two free layers 504 and 508 with a spacer layer 506 sandwiched between them, this three-layer magnetic resistance sensor is known as a trilayer magnetoresistive sensor.

To enable a trilayer magnetoresistive sensor such as using structure 500 to operate normally, a negative magnetic interaction must act between the two free layers 504 and 508. A negative magnetic interaction is an interaction in which the magnetic moments of the first and second free layers 504 and 508 have an anti-parallel interaction. The constant J which expresses this interactive force is expressed as a negative value of −0.05 erg/cm2. The symbol J expresses a parallel interaction when positive and an anti-parallel interaction when negative.

Seen from the perspective of the air bearing surface, the structure of the playback head has a permanent magnet positioned to the rear of the sensor with the moment of this magnet set in a direction perpendicular to the air bearing surface. This permanent magnet applies a bias magnetic field on the sensor in a direction perpendicular to the air bearing surface. As a result of this magnetic field, the magnetic moments of the first and second free layers 504 and 508 of the sensor 500 have structures which mutually intersect. Here, it is important that the magnetic interactive constant J for the first and second free layers 504 and 508 be negative to ensure that the magnetic moments of the first and second free layers 504 and 508 are structured to intersect with one another.

Where J is positive, the magnetic moment of the first and second free layers 504 and 508 is parallel. The magnetic field from the permanent magnet prevents the realization of a structure in which the magnetic moments of the first and second free layers 504 and 508 intersect.

For a sensor in which the structure of the magnetic moments of the first and second free layers 504 and 508 intersect when a magnetic field is applied in the depth direction perpendicular to the air bearing surface from the recording medium (positive magnetic field), the magnetic moments of the first and second free layers 504 and 508 go from having a structure which intersects to a parallel state. In this process, the resistance of the sensor is reduced.

If a negative magnetic field is applied in a perpendicular direction to the air bearing surface from the recording medium, the magnetic moments of the first and second free layers 504 and 508 have a structure which intersects, producing an anti-parallel field. In this process, the resistance of the sensor 500 increases. In other words where a positive magnetic field is applied from the recording medium, the resistance of the sensor 500 is reduced, but where a negative magnetic field is applied, the resistance of the sensor 500 increases. Because the resistance of the sensor varies linearly with respect to the magnetic field, it is possible to reproduce the signal recorded in the medium.

In the prior art, a conductive copper material is used for the spacer layer of a trilayer magnetoresistive sensor. This type of prior art sensor uses the principles of so-called CPP-GMR. With CPP-GMR, the magnetoresistive effect is created through interface scattering and bulk scattering of the transmitted electrons. With CPP-GMR, as the latter bulk scattering makes the greater contribution the film for the first and second free layer has to be made thicker to increase changes in the magnetoresistance. This, however, goes against the notion that the sensor film must be made thinner to create higher recording densities. Thus, a sensor which uses CPP-GMR cannot provide increased recording density.

As described above with a trilayer magnetoresistive sensor 500, it is important that the magnetic interactive constant J for the first and second free layers 504 and 508 be negative. It can, however, be difficult to obtain a large negative value for J. An embodiment of the present invention, however, discloses a structure for obtaining a large negative value for J. Also, an embodiment of the invention discloses a manner by which to make a sensor thinner.

FIRST EXEMPLARY EMBODIMENT

Figure 6:
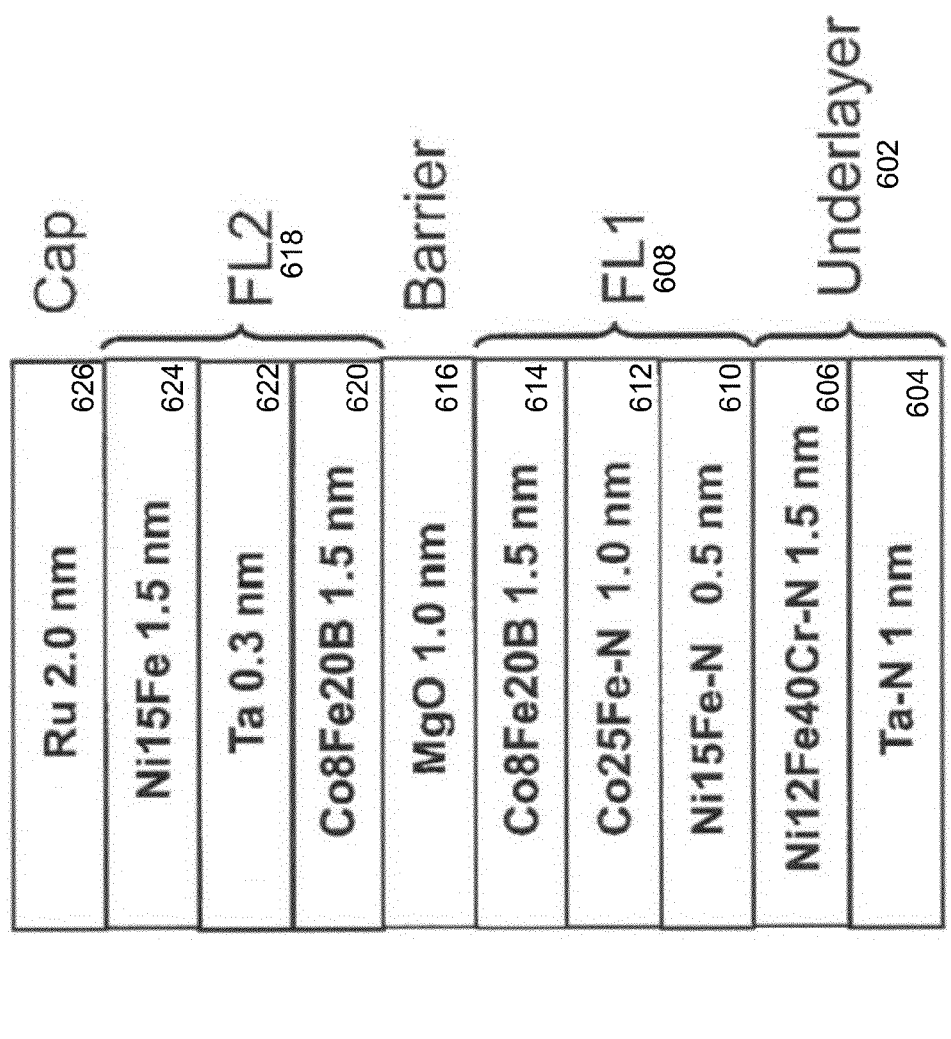
FIG. 6 shows a structure for a trilayer magnetoresistive sensor according to an embodiment of the invention.

In an embodiment of the invention as shown in FIG. 6, a trilayer magnetoresistive sensor 600 comprises an underlayer 602 on which a first free layer 608 is deposited. A barrier layer 616 is then deposited after which a second free layer 618 is deposited. A capping layer 626 is then deposited above second free layer 618.

The first free layer 608 is a layer which includes at least a layer 610 of a nitride of an element including at least one of Fe, Co, or Ni, or a multiple laminate structure of a layer containing a nitride of an element including at least one of Fe, Co, Ni and another ferromagnetic layer containing at least one of Fe, Co, or Ni. In an embodiment, second free layer 618 is an alloy ferromagnetic layer containing at least one element of Fe, Co and Ni, or a multiple laminate structure with a different composition of an alloy ferromagnetic layer containing at least one element of Fe, Co, and Ni.

The combination of first and second free layers 608 and 618 causes anti-parallel coupling (i.e., J<0) in the magnetic interaction between the first and second free layers 608 and 618.

The above sensor is a magnetic tunnel effect magnetoresistive sensor characterized in using an insulating material as the barrier layer 616. In an embodiment, the insulating material uses a material such as Mg—O as follows:

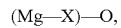

where X=Al, Zn, Fe, Co, Ni, Cu or similar materials.

To be described now are certain particular parameters in an embodiment of the invention. One of ordinary skill in the art will, however, understand that many variations are possible while keeping within the teachings of the present invention.

As shown in FIG. 6, underlayer 602 is made from Ta 604 that is 1.0 nm thick and NiFeCr 606 that is 1.5 nm thick. It is created by magnetron sputtering. The Ta film 604 uses a pure Ta target with the NiFeCr layer 606 using a target of Ni-12% Fe-40% Cr (at %), created with sputtering in Ar and N2 mixed gas (Ar: N2=10 sccm: 15 sccm). On top of underlayer 602 is formed a layer of NiFe—N 610 that is 0.5 nm thick, CoFe—N 612 that is 1.0 nm thick, and CoFeB 614 that is 1.5 nm thick that comprise first free layer 608, which is formed using magnetron sputtering. NiFe—N 610 is a nitride of NiFe, and CoFe—N 612 is a nitride of CoFe. The concentration of the nitride NiFe—N 610 and CoFe—N 612 is in the range of 15-25 at %. The NiFe film 610 uses an Ni-15% Fe (at %)

target, and the CoFe film 612 uses a Co-25% Fe (at %) target. These layers are formed using sputtering with a combination of Ar and N2 (Ar:N2=10 sccm:15 sccm). The CoFeB film 614 uses a target of Co-8% Fe-20 B (at %) and is formed using Ar gas sputtering. Barrier layer 616 is formed of MgO and is approximately 1.0 nm thick. It is formed on top of first free layer 608.

Barrier layer 616 is formed using an MgO target with magnetron sputtering. Second free layer 618 comprises CoFeB 620 that is 1.5 nm thick, Ta 622 that is 0.3 nm thick and NiFe 624 that is 1.5 nm thick.

Second free layer 618 is formed on top of barrier layer 616. The CoFeB film 620 is formed using a target of Co-8% Fe-20% B (at %) and the Ta film 622 is formed using a target of pure Ta. The NiFe film 624 uses a target of Ni-15% Fe (at %) and is created using Ar gas sputtering.

Capping layer 626 is made of Ru that is 2.0 nm thick. It is formed on top of second free layer 618.

CoFeB 614, which comprises first free layer 608 in contact with MgO 616, is preferably formed without using nitrogen gas when sputtering in order to increase the MR effect (i.e., rate of change in the resistance). Even without necessarily using nitrides for all of the layers which comprise the first free layer 608, the partial use of nitrides enables anti-parallel coupling interaction between the first and second free layers 608 and 618, respectively. Moreover, in the second free layer, a thin layer of Ta 622 as shown by CoFeB 620/Ta 622/NiFe 624 is also used to increase the MR effect (i.e., rate of change in the resistance).

In place of Ta 622, the use of a ferromagnetic amorphous magnetic alloy layer (e.g., an amorphous magnetic alloy layer containing at least one of Co, Fe, or Ni as a main component, and at least one of Ta, Hf Zr, Nb, or W; the concentration of these element is preferably at least 10 at % in total) with a thickness of 1.5 nm allows the same effect to be obtained.

The structure 600 of FIG. 6 provides advantages because the magnetic moment of the ferromagnetic material created by the d electrons of the ferromagnetic material. A d electron is comprised of an electron belonging to the minority band, which has a negative spin, and an electron belonging to the majority band, which has a positive spin. The magnetic moment of the ferromagnetic material is determined by the difference between the number of majority band electrons and the number of minority band electrons. Also, electrical conductivity of the ferromagnetic material is primarily delivered by d electrons having Fermi energy.

Figure 7:
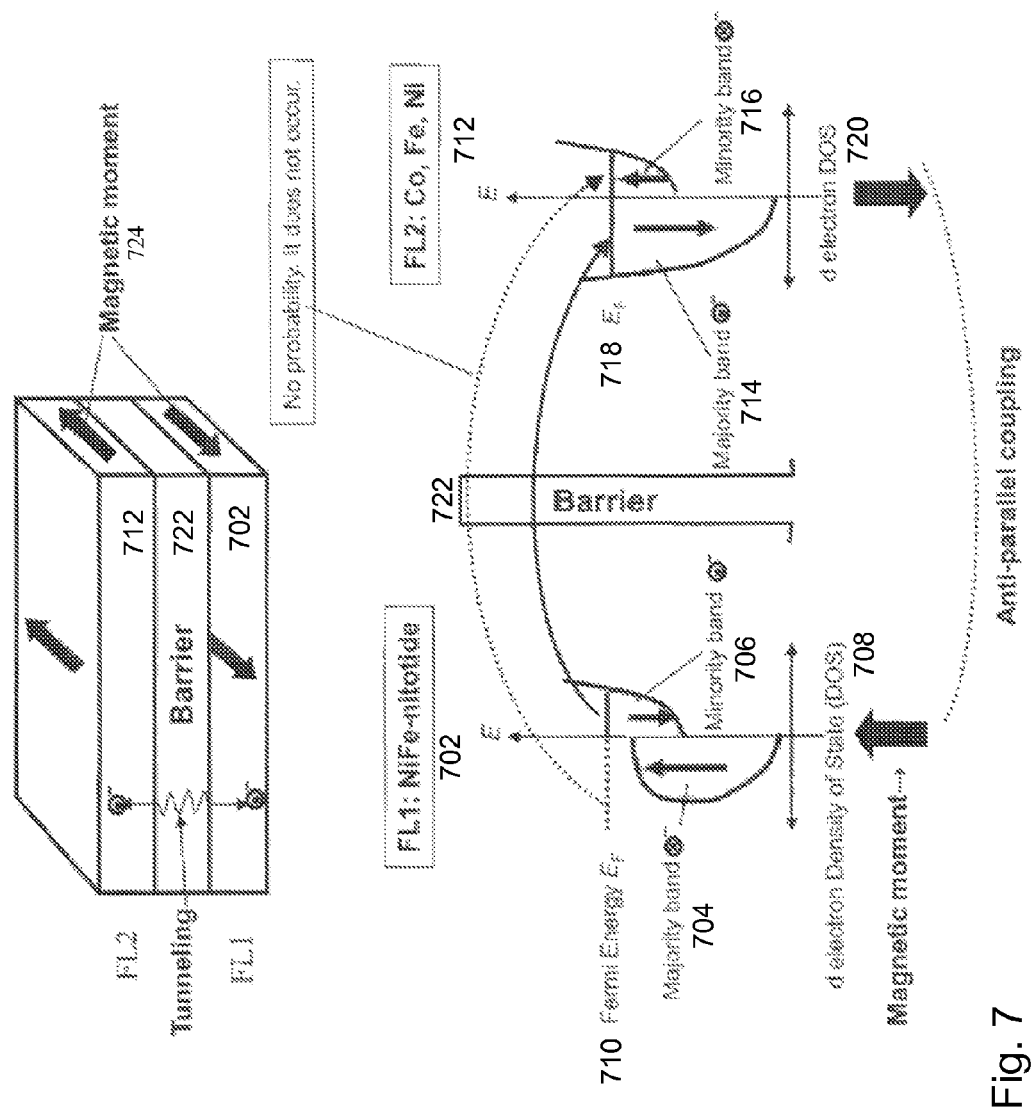
FIG. 7 shows a schematic diagram illustrating the band structure, magnetic interaction, and electrical conduction of the d electrons in FL1 and FL2 layers according to an embodiment of the invention.

FIG. 7 will now be used to assist in explaining the operation of this embodiment of the present invention. Because the first free layer 702 is a nitride of Fe, Co, Ni, the majority band 704 of the d electrons is completely occupied, with the minority band 706 being partially occupied (see the density of state 708 of FL1 in FIG. 7). Thus, there are no majority band electrons in the Fermi energy 710, and only minority electrons are present. As electrical conductivity is provided by electrons having a Fermi energy level, the minority band electrons confer electrical conductivity.

Because the second free layer 712 comprises a ferromagnetic body of Fe, Co, Ni, both the majority band 714 and the minority band 716 of the d electrons are partially occupied. Thus, there are electrons at the Fermi energy level 718 in the minority band 716 and the majority band 714, and, as the number of electrons in the majority band 714 becomes greater, the electrons of the majority band 714 confer most of the conductivity.

Where electricity passes between the first free layer 702 and the second free layer 712 via the barrier layer 722, the electrons migrate between the minority band 706 of the first free layer 702 and the majority band 714 of the second free layer 712. The electrons have a magnetic moment 724, and, with the migration between both free layers, an interactive force acts on the magnetic moment of the second free layer 712 majority electrons and the first free layer 702 minority electrons to make them parallel. With the magnetic moment of the first free layer 702, the minority electron spin is in the reverse direction. But with the magnetic moment of the second free layer 712 the majority spin is parallel so between the first free layer 702 and the second free layer 712, there is mutual interaction which cause antiparallel coupling between the magnetic moments. In this way it is possible to ensure that the magnetic interactive constant J for the first and second free layers 702 and 712 is negative.

Figure 8:
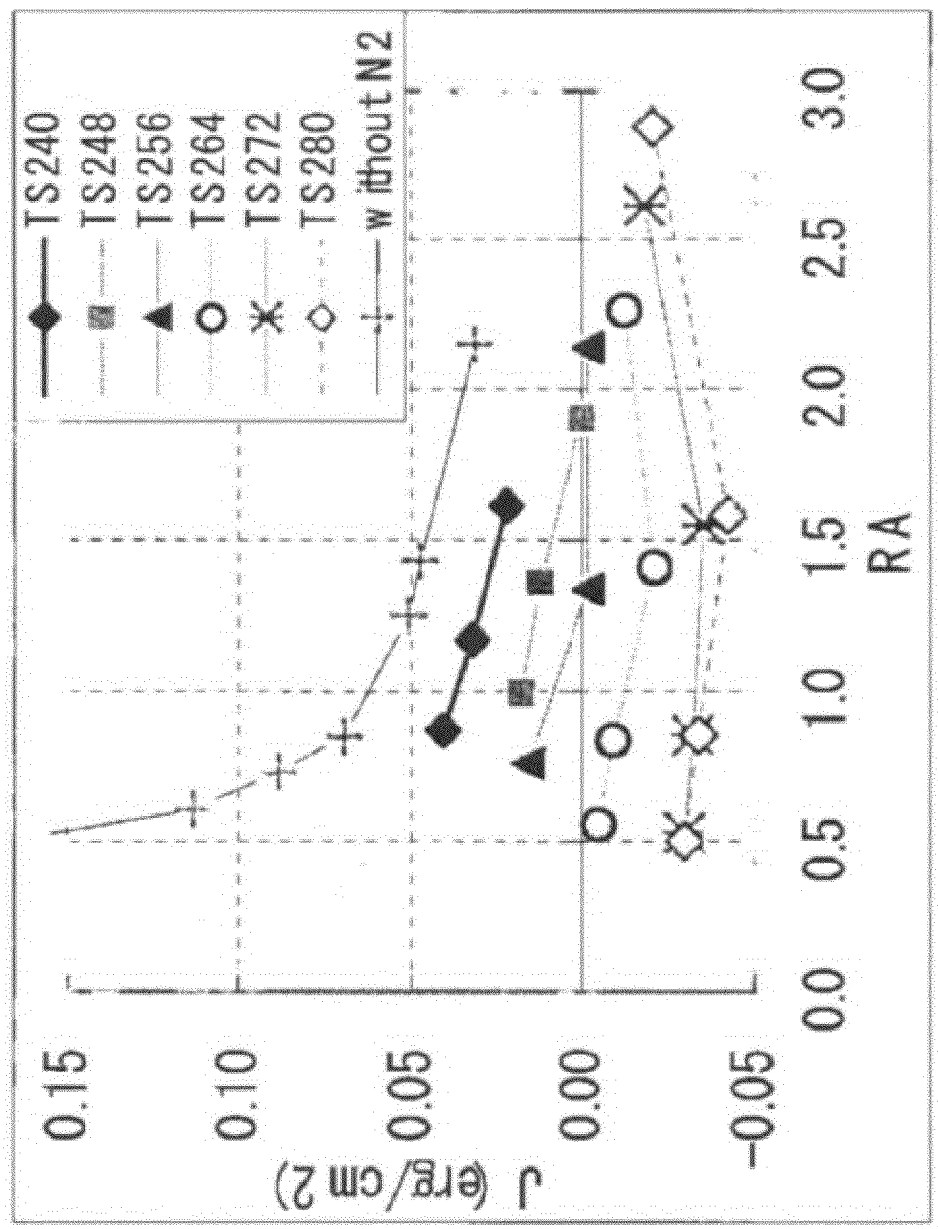
FIG. 8 is a graph illustrating the magnetic interaction according to an embodiment of the invention.

FIG. 8 shows the correlated coupling magnetic field interaction for films FL1 608 and FL2 618 made by making various changes to the sputtering time when creating the MgO film 616. FIG. 8 shows the target used when creating NiFe—N and CoFe—N films and the corresponding distance to the substrate as parameters. Nitrogen gas is introduced from the floor of the chamber, and the target is on the upper surface of the chamber. The greater the value for TS, the nearer the substrate is to the nitrogen gas introduction aperture. As the generation of nitrides progresses it is preferred to be closer to the nitrogen gas introduction aperture to ensure that the value for J is negative. The concentration of nitrogen gas in the NiFe—N film is 15 at % at TS256, 17 at % at TS264, 19 at % at TS272 and 22 at % at TS280. It is, therefore, possible to have a negative value for J by arranging suitable conditions for forming the MgO.

SECOND EXEMPLARY EMBODIMENT

Figure 9:
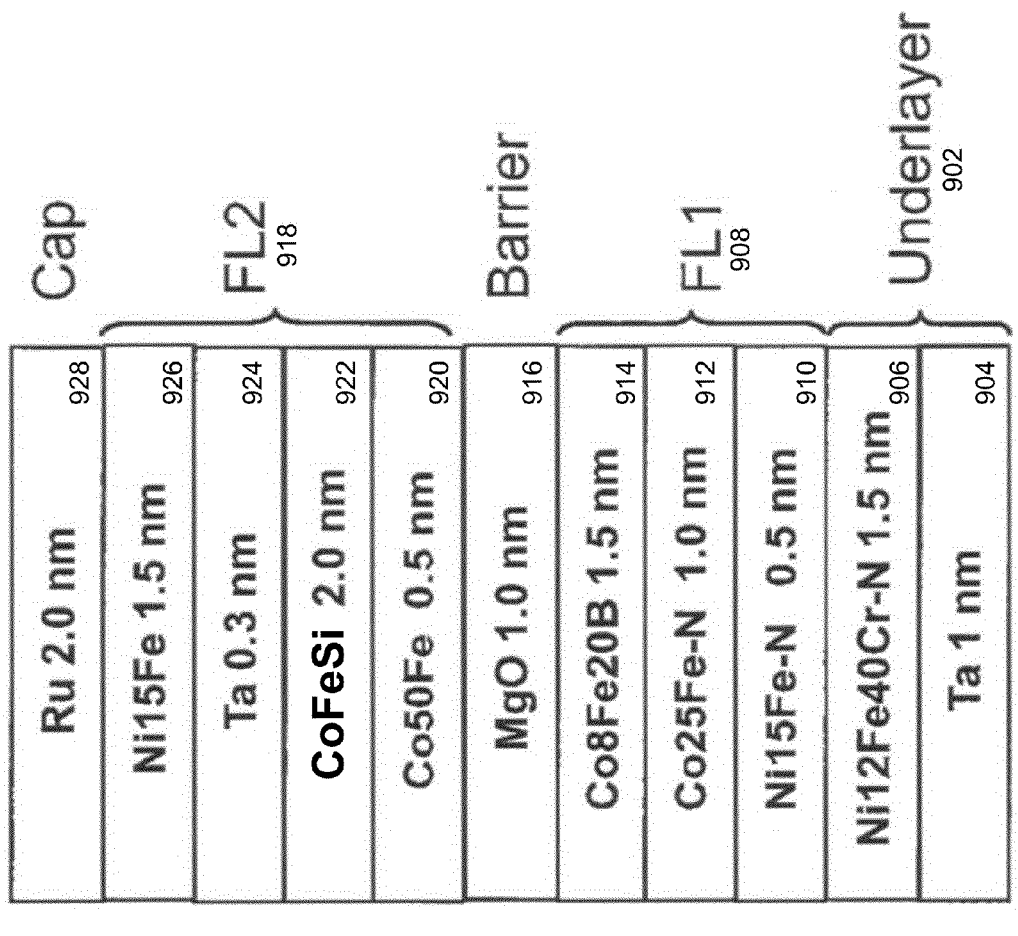
FIG. 9 shows a structure for a trilayer magnetoresistive sensor according to an embodiment of the invention.

In another embodiment of the invention as shown in FIG. 9, a trilayer magnetoresistive sensor 900 comprising an underlayer 902 on which first free layer 908 is formed. Barrier layer 916 is formed on first free layer 908, and second free layer 918 is formed on barrier layer 916. Capping layer 928 is then formed above second free layer 918.

First free layer 908 or the second free layer 918 includes a nitride of an element including at least one of Fe, Co, or Ni, or a multiple laminate structure of a layer containing a nitride of an element including at least one of Fe, Co, or Ni and another ferromagnetic layer containing at least one of Fe, Co, or Ni. The other free layer is preferably a Heusler ferromagnetic layer or a multiple laminate structure with a different composition of a Heusler ferromagnetic layer and an alloy ferromagnetic layer containing at least one element of Fe, Co, or Ni, thus causing anti-parallel coupling (i.e., J<0) in the magnetic interaction between the first and second free layers 908 and 918, respectively.

To be described now are certain particular parameters in this embodiment of the invention. One of ordinary skill in the art will, however, understand that many variations are possible while keeping within the teachings of the present invention.

Underlayer 902 is made from Ta 904 that is 1.0 nm thick. NiFeCr 906 is 1.5 nm thick. NiFe—N 910 is shown as being 0.5 nm thick. CoFe—N 912 is made 1.0 nm thick and CoFeB 914 is made 1.5 nm thick. Layers 910, 912, and 914 comprise first free layer 908 that is formed on underlayer 902. First free layer 908 is formed using magnetron sputtering. NiFe—N 910 is a nitride of NiFe, and CoFe—N 912 is a nitride of CoFe. The concentration of the nitride NiFe—N 910 and CoFe—N 912 is in the range of 10-30 at %. The NiFe film 910 uses an Ni-15% Fe (at %) target, and the CoFe film 912 uses a Co-25% Fe (at %) target which if formed using sputtering with a combination of Ar and N2 (Ar:N2=10 sccm:15 sccm). The CoFeB film 914 uses a target of Co-8% Fe-20 B (at %) and is formed using Ar gas sputtering.

A barrier layer 916 of MgO of approximately 1.0 nm thickness is formed on top of first free layer 908. This is produced using an MgO target with magnetron sputtering.

Second free layer 918 is formed. CoFe 920 is made 0.5 nm thick. Co-25 Fe-25 Si 922 is made 2.0 nm thick, and Ta 924 is made 0.3 nm thick. NiFe 926 is made 1.5 nm thick. Free layer 918 is formed on top of barrier layer 916 which is made of MgO. The CoFe film 920 uses a target of Co-50% Fe (at %), and is created using Ar gas sputtering. The Co-25 Fe-25 Si film 922 is a Heusler alloy and is formed using a Co-33% Fe (at %) target and an Si target with simultaneous sputtering and simultaneous discharge in an atmosphere of Ar gas. The discharge power for the Co-33 Fe (at %) target and Si target are adjusted so that the composition of Co, Fe, and Si is an optimal combination. The formation of Co-25 Fe-25 Si 922 is done by heating the substrate to above 200° C.

After forming the Co-25 Fe-25 Si 922 but before forming the Ta film 924, the intermediate structure is annealed for more than 20 minutes at a temperature of more than 300° C. in a vacuum. Thereafter the substrate is briefly cooled and the Ta film 924 is deposited using Ar gas sputtering with a target of pure Ta. NiFe film 926 is deposited using a target of Ni-15% Fe (at %).

Capping layer 928 made of Ru at a thickness 2.0 nm is formed on top of the second free layer 918.

The CoFeB 914, which comprises the first free layer 908, is below MgO barrier layer 916 and is preferably formed without using nitrogen gas when sputtering in order to increase the MR effect (i.e., rate of change in the resistance). Even without necessarily using nitrides for all of the layers which comprise first free layer 908. The partial use of nitrides enable anti-parallel coupling interaction between the first and second free layers 908 and 918, respectively. Moreover, in the second free layer 918, a thin layer of Ta 924 as shown above CoFe 920 (0.5 nm), Co-25 Fe-25 Si 922 (2.0 nm), Ta 924 (0.3 nm), and NiFe 926 (1.5 nm) is also used to increase the MR effect (i.e., rate of change in the resistance). Instead of using Ta 924, the use of a ferromagnetic amorphous magnetic alloy layer (e.g., an amorphous magnetic alloy layer containing at least one of Co, Fe, Ni as a main component, and at least one of Ta, Hf Zr, Nb, or W, the concentration of these element being at least 10 at % in total) with a thickness of 0.3 nm allows the same effect to be obtained. It is, therefore, possible to have a negative value for J (less than −0.05 erg/cm2) by arranging suitable values for forming the MgO.

In the same way that the Co-25 Fe-25 Si film 922, a Co-25 Fe-25 Al film and Co-25 Mn-25 Ge can both be formed from ordered Heusler alloys. In place of the Co-25 Fe-25 Si film 922, it is possible to use a Co-25 Fe-25 Al film or Co-25 Mn-25 Ge.

Figure 10:
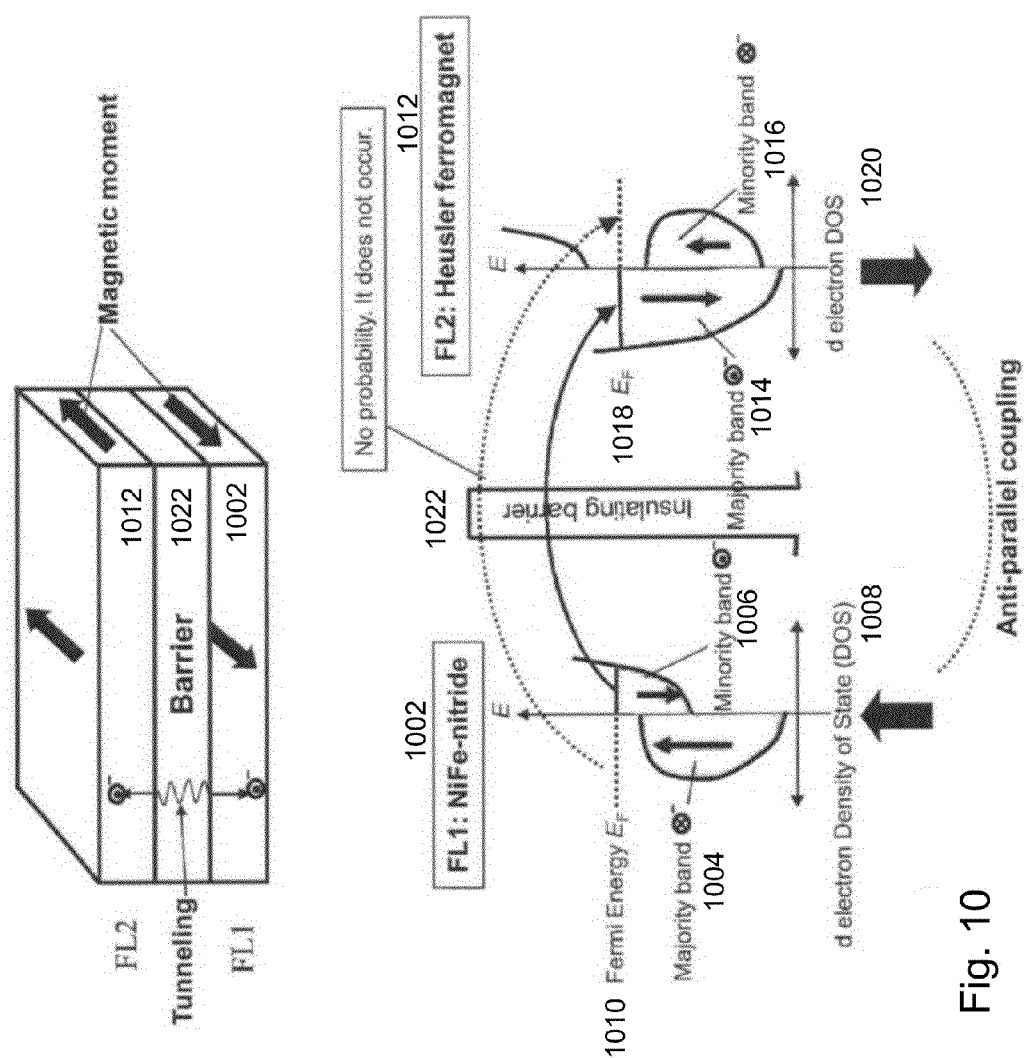
FIG. 10 shows a schematic diagram illustrating the band structure, magnetic interaction, and electrical conduction of the d electrons in FL1 and FL2 layers according to an embodiment of the invention.

FIG. 10 will now be used to assist in explaining the operation of this embodiment of the present invention. Because the first free layer 1002 comprises a nitride of Fe, Co, or Ni, the d electron of the minority band 1006 confer the electrical conductivity. At the same time, the d electrons of the Heusler ferromagnetic body have the majority band 1014 partially occupied, with the minority band 1016 completely occupied. Only the majority band 1014 electrons have Fermi energy 1018 with the electrons of the majority band 1014 conferring electrical conductivity.

Electricity passes between first free layer 1002 and second free layer 1012 via barrier layer 1022 in a similar way as described with reference to FIG. 7. Thus, in a similar way, it is possible to ensure that the magnetic interactive constant, J, for the first and second free layers 1002 and 1012, respectively, is negative.

THIRD EXEMPLARY EMBODIMENT

Figure 11:
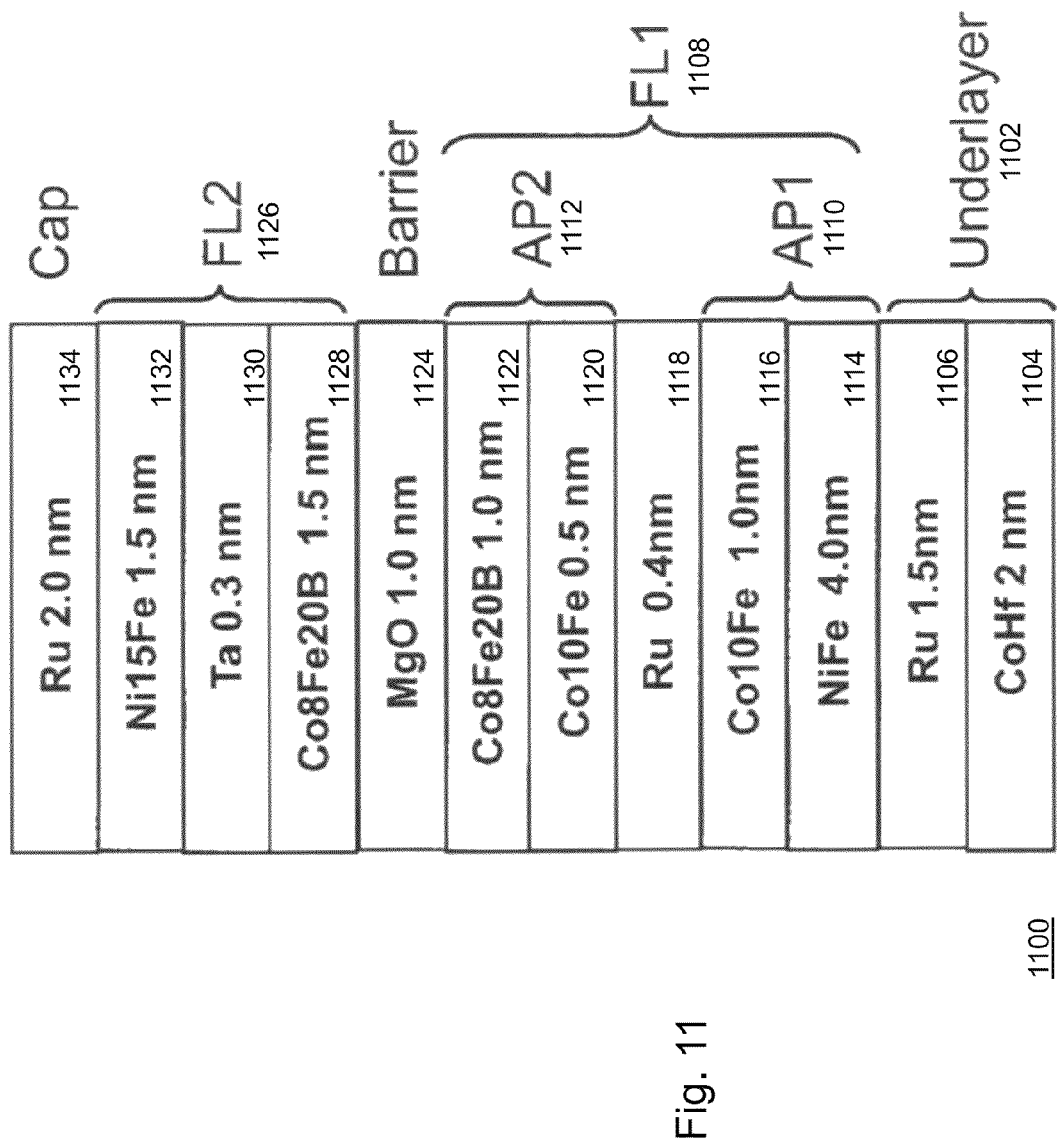
FIG. 11 shows a structure for a trilayer magnetoresistive sensor according to an embodiment of the invention.

Another embodiment of the invention provides a trilayer magnetoresistive sensor 1100 as shown in FIG. 11. Trilayer magnetoresistive sensor 1100 comprises an underlayer 1102 with first free layer 1108 above. Barrier layer 1124 is formed over first free layer 1108. Second free layer 1126 is formed above barrier layer 1124. Cap layer 1134 is formed above second free layer 1126.

First free layer 1108 comprises first ferromagnetic layer (AP1) 1110, antiparallel coupling layer 1118, and second ferromagnetic layer (AP2) 1112 which is in below barrier layer 1124. With the magnetic moment of AP1 1110 and AP2 1112 in an anti-parallel state, the magnetic moment of AP1 1110 is greater than the magnetic moment of AP2 1112. The second free layer 1126 comprises two ferromagnetic layers 1128 and 1132. Ferromagnetic layers 1128 and 1132 are ferromagnetic layers which include at least one element of Fe, Co or Ni, or a multiple laminate structure with a different composition of alloy ferromagnetic layers containing at least one element of Fe, Co, or Ni. The magnetic interaction effect between AP2 1112 and the second free layer 1126 is parallel coupling (i.e., J>0). The magnetic moment of the first free layer 1108 (e.g., the combined magnetic moment of AP1 1110 and AP2 1112) is anti-parallel to the magnetic moment of AP2 1112, so there is anti-parallel coupling (i.e., J<0) in the magnetic interaction between the first and second free layers 1108 and 1126, respectively.

In this embodiment of the invention, first free layer (FL1) 1108 comprises strongly anti-parallel coupled first and second ferromagnetic layers (AP1 1110 and AP2 1112) with an interposing anti-parallel coupling layer (APC) 1118. Because the magnetic moment of AP1 1110 is greater than the magnetic moment of AP2 1112, the magnetic moment of the first free layer 1108 is opposite to the magnetic moment of AP2 1112. The second free layer 1126 comprises at least one ferromagnetic layer. As shown, it comprises two ferromagnetic layers 1128 and 1132. The combination of ferromagnetic layers 1128 and 1132 employs an alloy ferromagnetic material containing an element of at least one of Fe, Co, or Ni. AP2 1112 and the second free layer 1126 next to barrier layer 1124 have a positive magnetic interaction. Because the magnetic moment of the first free layer 1108 is anti-parallel to the magnetic moment of AP2 1112, it is possible to ensure that magnetic interactive constant J of the first and second free layers 1108 and 1126 is negative.

In this embodiment of the invention, an insulating material is provided in the barrier layer 1124 because the method of transmission is tunnelling transmission. With tunnelling transmission, it is possible to achieve larger changes in resistance than with CPP-GMR even where the film thickness of the first and second free layers 1108 and 1126 is thin, but is advantageous in making the sensor thinner.

Third Structure of the Invention: (FIG. 11)

As shown in FIG. 11, CoHf 1104 is deposited to be 2.0 nm thick. Ru 1106 is deposited to be 1.5 nm thick. Together layers 1104 and 1106 form underlayer 1102. In an embodiment, underlayer 1102 is formed using magnetron sputtering. CoHf film 1104 uses a target of Co-30% Hf (at %), and Ru film 1106 uses a target of pure Ru. These layers are formed by sputtering in Ar gas.

NiFe 1114 is deposited to be 4.0 nm. CoFe 1116 is deposited to be 1.0 nm thick. Together, layers 1114 and 1116 comprise AP1 1110. Ru 1118 is then deposited to be 0.4 nm thick. Afterwards, CoFe 1120 and CoFeB 1122 comprise AP2 1112. Layers 1120 and 1122 are formed by magnetron sputtering.

Because Ru film 1118 exerts an anti-parallel coupling effect on the adjacent ferromagnetic film due to RKKY interaction, the magnetic moments of AP1 1110 and AP2 1112 are strongly anti-parallel coupled. Here, the NiFe film 1114 in AP1 1110 is formed with a target of Ni-15% Fe (at %), and the CoFe film 1116 in AP1 1110 is deposited with a target of Co-10% Fe (at %). Ru film 1118 is formed using a target of pure Ru.

CoFe film 1120 in AP2 1112 is deposited using a target of Co-10% Fe (at %). CoFeB film 1122 in AP2 1112 is deposited using a target of Co-8% Fe-20 B (at %) using Ar gas sputtering.

The barrier layer 1124 is comprised of MgO over first free layer 1108 and is formed to a thickness of approximately 1.0 nm. Barrier layer 1124 is deposited using magnetron sputtering with a target of MgO. Second free layer 1126 comprises CoFeB 1128 at a thickness of 1.5, Ta 1130 at a thickness of 0.3, and NiFe 1132 at a thickness of 1.5 nm. Free layer 1126 is formed over barrier layer 1124. CoFeB film 1128 is deposited using a target of Co-8% Fe-20% B (at %). The Ta film 1130 is deposited using a target of pure Ta. NiFe film 1132 is deposited using a target of Ni-15% Fe (at %). These layers are formed using Ar gas sputtering.

Capping layer 1134 comprises Ru at a thickness of 2.0 nm. Capping layer 1134 is formed above free layer 1126.

Because AP2 1112 and FL1 1108 are both normal ferromagnetic bodies of Fe, Co, Ni, or the like, there is an interaction on AP2 1112 and FL2 1126 via barrier layer 1124 comprising MgO. This ensures that the interaction is parallel. There is also a strong interaction on AP1 1110 and AP2 1112 in the an anti-parallel direction via Ru 1118. Because the magnetic moment of AP1 1110 is larger than the magnetic moment of AP2 1112, and because the magnetic moment of FL1 1108 is parallel to AP1 1110, there is an interaction between FL1 1108 and FL2 1126 which operates to make their magnetic moments anti-parallel. In this way, it is possible to ensure that the value of J between FL1 1108 and FL2 1126 is negative.

Because CoHf film 1104 is a softly-magnetic ferromagnetic film, it can function as part of the shield. In this embodiment, the film thickness of sensor 1100 comprising CoHf layer 1104 is 16.7 nm. Because CoHf 1104 functions as part of the shield, it is possible to bring the read gap down to as thin as 14.7 nm when using sensor film 1100. This allows for the production of a thinner read head for higher recording densities.

It should be appreciated by those skilled in the art that the specific embodiments disclosed above may be readily utilized as a basis for modifying or designing other write elements. It should also be appreciated by those skilled in the art that such modifications do not depart from the scope of the invention as set forth in the appended claims.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the read/write while maintaining substantially the same functionality without departing from the scope and spirit of the present invention.

What is claimed is:

1. A method for manufacturing a trilayer sensor, comprising:
    depositing an underlayer;
    depositing a first free layer on the underlayer, wherein the first free layer comprises a nitride of an element including at least one of Fe, Co, or Ni;
    depositing a barrier layer on the first free layer, wherein the barrier layer is comprised of an insulating material;
    depositing a second free layer on the barrier layer, wherein the second free layer comprises an alloy ferromagnetic layer that does not include a nitride, wherein composition of the first free layer and second free layer results in anti-parallel coupling interaction between the first free layer and the second free layer; and
    depositing a cap layer on the second free layer.

2. The method of claim 1, wherein the barrier layer is made of (Mg—X)—O, wherein X is a material chosen from Al, Zn, Fe, Co, Ni, and Cu.

3. The method of claim 1, wherein the underlayer is made of a material containing Ta.

4. The method of claim 1, wherein the underlayer is made of a material containing TaN.

5. The method of claim 1, wherein the first free layer comprises a multiple laminate structure containing a nitride of an element including at least one of Fe, Co, Ni and another ferromagnetic layer containing at least one of Fe, Co, or Ni.

6. The method of claim 1, wherein the first free layer comprises at least two sublayers.

7. The method of claim 6, wherein a sublayer most closely adjacent to the barrier layer comprises CoFeB.

8. The method of claim 1, wherein the second free layer comprises an alloy ferromagnetic layer containing at least one element of Fe, Co and Ni.

9. The method of claim 1, wherein the second free layer comprises a multiple laminate structure with a different composition of an alloy ferromagnetic layer containing at least one element of Fe, Co, and Ni.

10. The method of claim 1, wherein the second free layer comprises at least two sublayers.

11. The method of claim 10, wherein a sublayer most closely adjacent to the barrier layer comprises CoFeB.

12. A trilayer sensor, comprising:
    an underlayer;
    a first free layer on the underlayer, wherein the first free layer comprises a nitride of an element including at least one of Fe, Co, or Ni;
    a barrier layer on the first free layer, wherein the barrier layer is comprised of an insulating material;
    a second free layer on the barrier layer, wherein the second free layer comprises an alloy ferromagnetic layer that does not include a nitride, wherein composition of the first free layer and second free layer results in anti-parallel coupling interaction between the first free layer and the second free layer; and
    a cap layer on the second free layer.

13. The sensor of claim 12, wherein the barrier layer is made of (Mg—X)—O, wherein X is a material chosen from Al, Zn, Fe, Co, Ni, and Cu.

14. The sensor of claim 12, wherein the underlayer is made of a material containing Ta.

15. The sensor of claim 12, wherein the underlayer is made of a material containing TaN.

16. The sensor of claim 12, wherein the first free layer comprises a multiple laminate structure containing a nitride of an element including at least one of Fe, Co, Ni and another ferromagnetic layer containing at least one of Fe, Co, or Ni.

17. The sensor of claim 12, wherein the first free layer comprises at least two sublayers.

18. The sensor of claim 17, wherein a sublayer most closely adjacent to the barrier layer comprises CoFeB.

19. The sensor of claim 12, wherein the second free layer comprises an alloy ferromagnetic layer containing at least one element of Fe, Co and Ni.

20. The sensor of claim 12, wherein the second free layer comprises a multiple laminate structure with a different composition of an alloy ferromagnetic layer containing at least one element of Fe, Co, and Ni.

21. The sensor of claim 12, wherein the second free layer comprises at least two sublayers.

22. The sensor of claim 21, wherein a sublayer most closely adjacent to the barrier layer comprises CoFeB.

\* \* \* \* \*